(12) United States Patent
Shi et al.

(10) Patent No.: US 9,960,283 B2
(45) Date of Patent: May 1, 2018

(54) THIN-FILM TRANSISTOR

(71) Applicant: Shenzhen China Star Optoelectronics Technology Co., Ltd., Shenzhen, Guangdong (CN)

(72) Inventors: Longqiang Shi, Guangdong (CN); Zhiyuan Zeng, Guangdong (CN); Hejing Zhang, Guangdong (CN); Yutong Hu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days. days.

(21) Appl. No.: 14/416,767

(22) PCT Filed: Dec. 22, 2014

(86) PCT No.: PCT/CN2014/094555
§ 371 (c)(1),
(2) Date: Jan. 23, 2015

(87) PCT Pub. No.: WO2016/090674
PCT Pub. Date: Jun. 16, 2016

(65) Prior Publication Data
US 2016/0163881 A1 Jun. 9, 2016

(30) Foreign Application Priority Data
Dec. 9, 2014 (CN) .......................... 2014 1 0748282

(51) Int. Cl.
*H01L 29/02* (2006.01)
*H01L 29/786* (2006.01)
*H01L 29/417* (2006.01)

(52) U.S. Cl.
CPC .... *H01L 29/78696* (2013.01); *H01L 29/4175* (2013.01); *H01L 29/41733* (2013.01); *H01L 29/78648* (2013.01)

(58) Field of Classification Search
CPC ...................... H01L 29/78696; H01L 29/4175
See application file for complete search history.

(56) References Cited

U.S. PATENT DOCUMENTS

2003/0020065 A1* 1/2003 Honda ................ H01L 29/6675
257/67
2007/0048992 A1* 3/2007 Hosokawa ............ C23C 14/566
438/597

(Continued)

FOREIGN PATENT DOCUMENTS

CN 101252134 A 8/2008
CN 102969362 A 3/2013

*Primary Examiner* — Marc Armand
*Assistant Examiner* — Sarah Salerno
(74) *Attorney, Agent, or Firm* — Andrew C. Cheng

(57) ABSTRACT

Disclosed is a thin-film transistor. The thin-film transistor includes: a substrate; a first gate, a first gate insulation layer, a semiconductor layer, an etching stop layer, and the second gate stacked on a surface of the substrate, in which the semiconductor layer has a thickness of 200 nm-2000 nm; the etching stop layer includes a first via and a second via formed therein; and the first via and the second via are arranged to each correspond to the semiconductor layer; and a source and a drain respectively extending through the first via and the second via to connect to the semiconductor layer. The thin-film transistor has an increased ON-state current and switching speed.

10 Claims, 4 Drawing Sheets

(56) References Cited

U.S. PATENT DOCUMENTS

| | | | |
|---|---|---|---|
| 2008/0296568 A1 | 12/2008 | Ryu et al. | |
| 2009/0206332 A1* | 8/2009 | Son | H01L 29/42384 |
| | | | 257/43 |
| 2011/0079787 A1* | 4/2011 | Choi | H01L 29/4908 |
| | | | 257/71 |
| 2011/0159646 A1 | 6/2011 | Ryu et al. | |
| 2012/0146713 A1 | 6/2012 | Kim et al. | |

* cited by examiner

THIN-FILM TRANSISTOR

CROSS REFERENCE TO RELATED APPLICATIONS

This application claims the priority of Chinese Patent Application No. 201410748282.3, entitled "Thin-Film Transistor", filed on Dec. 9, 2014, the disclosure of which is incorporated herein by reference in its entirety.

BACKGROUND OF THE INVENTION

1. Field of the Invention

The present invention relates to the field of manufacture of thin-film transistors, and in particular to a thin-film transistor having an increased ON-state current.

2. The Related Arts

Thin-film transistors (TFTs) have been widely used as a switch device in electronic devices such as liquid crystal displays. A dual-gate TFT is a specific type of TFT, which has attracted much attention due to being applicable to display devices of high pixels per inch (PPI). For a dual-gate TFT, a high On-state current helps increase the switching speed of the dual-gate TFT. To increase the ON-state current of the dual-gate TFT, a commonly adopted solution is to increase the channel width of the dual-gate TFT or to reduce the channel length. However, increasing the channel width of the dual-gate TFT would reduce aperture ratio of a liquid crystal display device; and reducing the channel length of the dual-gate TFT would cause short channel effects. In brief, the conventional dual-gate TFT has a small ON-state current and this leads to a slow switching speed of the dual-gate TFT.

SUMMARY OF THE INVENTION

The present invention provides a thin-film transistor, which increases the ON-state current of the thin-film transistor and thus increases the switching speed of the thin-film transistor.

In a first aspect, the present invention provides a thin-film transistor. The thin-film transistor comprises:

a substrate;

a first gate, a first gate insulation layer, a semiconductor layer, an etching stop layer, and a second gate stacked on a surface of the substrate, wherein the semiconductor layer has a thickness of 200 nm-2000 nm;

the etching stop layer comprising a first via and a second via formed therein, the first via and the second via being arranged to each correspond to the semiconductor layer; and a source and a drain, which respectively extend through the first via and the second via to connect to the semiconductor layer.

In the above thin-film transistor, the thin-film transistor further comprises a passive layer, which is stacked on the second gate. The passive layer comprises a third via and a fourth via formed therein. The third via is connected to and communicates with the first via. The fourth via is connected to and communicates with the second via. The source extends through the third via and the first via to connect to the semiconductor layer. The drain extends through the fourth via and the second via to connect to the semiconductor layer.

In the above thin-film transistor, the thin-film transistor further comprises a first ohmic contact layer. The first ohmic contact layer is arranged between the source and the semiconductor layer. The source is connected, via the first ohmic contact layer, to the semiconductor layer.

In the above thin-film transistor, the thin-film transistor further comprises a second ohmic contact layer. The second ohmic contact layer is arranged between the drain and the semiconductor layer. The drain is connected, via the second ohmic contact layer, to the semiconductor layer.

In the above thin-film transistor, the semiconductor layer has a lateral size that is greater than a lateral size of the first gate and is also greater than a lateral size of the second gate.

Compared to the prior art, the thickness of the semiconductor layer is set to be 200 nm-2000 nm, and such a thickness of the semiconductor layer allows for formation of two current channels in the semiconductor layer. The thin-film transistor has an ON-state current that is a sum of the currents of the two current channels. Thus, the thin-film transistor can have an increased ON-state current and accordingly, the switching speed of the thin-film transistor is increased.

In another aspect, the present invention provides a thin-film transistor. The thin-film transistor comprises:

a substrate;

a first gate, a first gate insulation layer, at least two semiconductor layers, an etching stop layer, and a second gate stacked on a surface of the substrate;

the etching stop layer comprising a first via and a second via formed therein, the first via and the second via being arranged to each correspond to the semiconductor layer; and a source and a drain, which respectively extend through the first via and the second via to connect to the semiconductor layer.

In the above thin-film transistor, the thin-film transistor further comprises a passive layer, which is stacked on the second gate. The passive layer comprises a third via and a fourth via formed therein. The third via is connected to and communicates with the first via. The fourth via is connected to and communicates with the second via. The source extends through the third via and the first via to connect to the semiconductor layers. The drain extends through the fourth via and the second via to connect to the semiconductor layers.

In the above thin-film transistor, the thin-film transistor further comprises a first ohmic contact layer. The first ohmic contact layer is arranged between the source and the semiconductor layers. The source is connected, via the first ohmic contact layer, to the semiconductor layers.

In the above thin-film transistor, the thin-film transistor further comprises a second ohmic contact layer. The second ohmic contact layer is arranged between the drain and the semiconductor layers. The drain is connected, via the second ohmic contact layer, to the semiconductor layers.

In the above thin-film transistor, the semiconductor layers have a lateral size that is greater than a lateral size of the first gate and is also greater than a lateral size of the second gate.

Compared to the prior art, the semiconductor layer of the present invention comprises at least two semiconductor layers. Thus, the thin-film transistor can form at least two current channels therein. The thin-film transistor has an ON-state current that is a sum of the currents of all the current channels. Thus, the thin-film transistor can have an increased ON-state current and accordingly, the switching speed of the thin-film transistor is increased.

BRIEF DESCRIPTION OF THE DRAWINGS

To more clearly explain the technical solutions proposed in embodiments of the present invention and those of the prior art, a brief description of the drawings that are necessary for describing the embodiments of the present invention and the prior art is given as follows. It is obvious that the drawings that will be described below show only some embodiments of the present invention. For those having ordinary skills of the art, other drawings may also be readily available from these attached drawings without the expense of creative effort and endeavor.

DETAILED DESCRIPTION OF THE PREFERRED EMBODIMENTS

A clear and complete description will be given to technical solutions of embodiments of the present invention with reference to the attached drawings of the embodiments of the present invention. However, the embodiments so described are only some, but not all, of the embodiments of the present invention. Other embodiments that are available to those having ordinary skills of the art without the expense of creative effort and endeavor are considered belonging to the scope of protection of the present invention.

Figure 1:
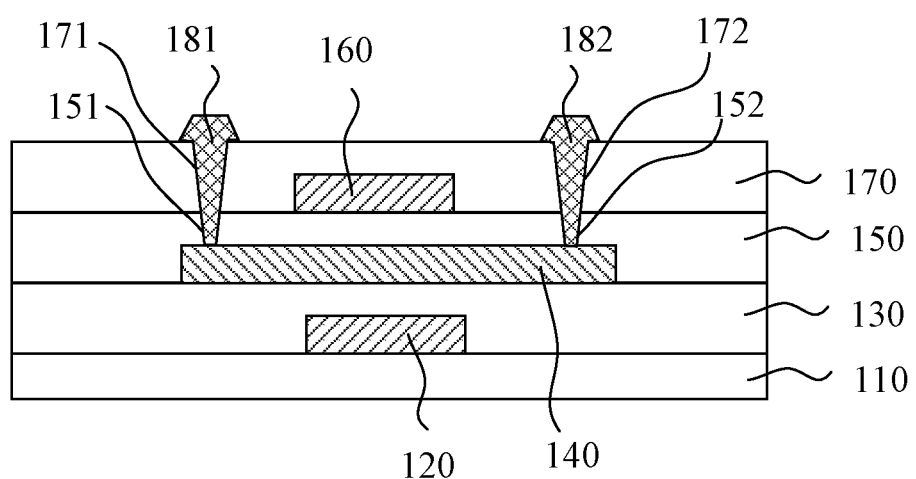
FIG. 1 is a schematic view showing a cross-sectional structure of a thin-film transistor according to a preferred embodiment of the present invention.

Referring to FIG. 1, FIG. 1 is a schematic view showing a cross-sectional structure of a thin-film transistor according to a preferred embodiment of the present invention. The thin-film transistor (TFT) 100 comprises a substrate 110 and a first gate 120, a first gate insulation layer 130, a semiconductor layer 140, an etching stop layer 150, and a second gate 160 stacked on a surface of the substrate 110, in which the semiconductor layer 140 has a thickness of 200 nm-2000 nm. The etching stop layer 150 comprises a first via 151 and a second via 152 formed therein. The first via 151 and the second via 152 are arranged to each correspond to the semiconductor layer 140. The thin-film transistor 100 further comprises a source 181 and a drain 182. The source 181 and the drain 182 respectively extend through the first via 151 and the second via 152 to connect to the semiconductor layer 140.

In other embodiments, the thin-film transistor 100 further comprises a buffering layer (not shown). The buffering layer functions to buffer the stress induced in the substrate 110 in forming other structures of the thin-film transistor 100 thereon so as to prevent damage or cracking of the substrate 110. Under this condition, the first gate 120, the first gate insulation layer 130, the semiconductor layer 140, the etching stop layer 150, and the second gate 160 are stacked, through the buffering layer, on the substrate 110. The buffering layer comprises a material selected from one of a silicon oxide layer, a silicon nitride layer, a silicon oxynitride layer, and combinations thereof.

The substrate 110 can be a glass substrate, a plastic substrate, or an insulation substrate.

The first gate 120 is arranged on a middle portion of the surface of the substrate 110. The first gate 120 comprises a material that is a metal or a metal alloy. In one embodiment, the material of the first gate 120 is selected from one of copper, tungsten, chromium, aluminum, and combinations thereof. The first gate 120 can be formed through the following steps. Firstly, a metal layer is completely formed on the entire surface of the substrate to form a complete metal layer. For easy description, the complete metal layer formed on the entire surface of the substrate is referred to as the "first metal layer". The first metal layer is then patternized to form the first gate 120 that is located on the middle portion of the substrate 110 according to the instant embodiment.

The first gate insulation layer 130 is set on and covers the first gate 120 and the substrate 110. The first gate insulation layer 130 comprises a material selected from one of a silicon oxide layer, a silicon nitride layer, a silicon oxynitride layer, and combinations thereof.

The semiconductor layer 140 is arranged on a surface of the first gate insulation layer 130 that is distant from the first gate 120. The semiconductor layer 140 provides a channel that is conducted on or off between the source 181 and the drain 182 of the thin-film transistor 100. The etching stop layer 150 is set on and covers the semiconductor layer 140.

The second gate 160 is arranged on a middle portion of a surface of the etching stop layer 150 that is distant from the semiconductor layer 140. The second gate 160 comprises a material that is a metal or a metal alloy. The material of the second gate 160 is selected from one of copper, tungsten, chromium, aluminum, and combinations thereof. In one embodiment, the material of the second gate 160 is the same as that of the first gate 120. In other embodiments, the material of the second gate 160 is different from the material of the first gate 120.

The thin-film transistor 100 further comprises a passive layer 170. The passive layer 170 is arranged on the second gate 160 and the passive layer 170 comprises a third via 171 and a fourth via 172 formed therein. The third via 171 is connected to and in communication with the first via 151 and the fourth via 172 is connected to and in communication with the second via 152. The source 181 extends through the third via 171 and the first via 151 to connect to the semiconductor layer 140, and the drain 182 extends through the fourth via 172 and the second via 152 to connect to the semiconductor layer 140.

The source 181 and the drain 182 are arranged to respectively correspond to two ends of the semiconductor layer 140. In one embodiment, the source 181 and the drain 182 are formed of a transparent conductive material. Specifically, a layer of a transparent conductive material is formed on a surface of the passive layer 170 that is distant from the second gate 160 and is then patternized to define the source 181 and the drain 182. The source 181 and the drain 182 can be metals or metal alloys, or can alternatively comprise one of indium tin oxide, indium zinc oxide, indium oxide, and zinc oxide or any combination thereof.

The thin-film transistor 100 further comprises a first ohmic contact layer (not shown). The first ohmic contact layer is arranged between the source 181 and the semiconductor layer 140 so that the source 181 is connected via the first ohmic contact layer to the semiconductor layer 140. The first ohmic contact layer functions to reduce a contact resistance between the source 181 and the semiconductor layer 140.

The thin-film transistor 100 further comprises a second ohmic contact layer (not shown). The second ohmic contact layer is arranged between the drain 182 and the semiconductor layer 140 so that the drain 182 is connected via the second ohmic contact layer to the semiconductor layer 140.

The second ohmic contact layer functions to reduce a contact resistance between the drain 182 and the semiconductor layer 140.

The semiconductor layer 140 has a lateral size that is greater than a lateral size of the first gate 120 and is also greater than a lateral size of the second gate 160. In the instant embodiment, a lateral direction is defined as a direction perpendicular to a direction of stacking the first gate 120, the first gate insulation layer 130, the semiconductor layer 140, the etching stop layer 150, and the second gate 160.

Figure 2:
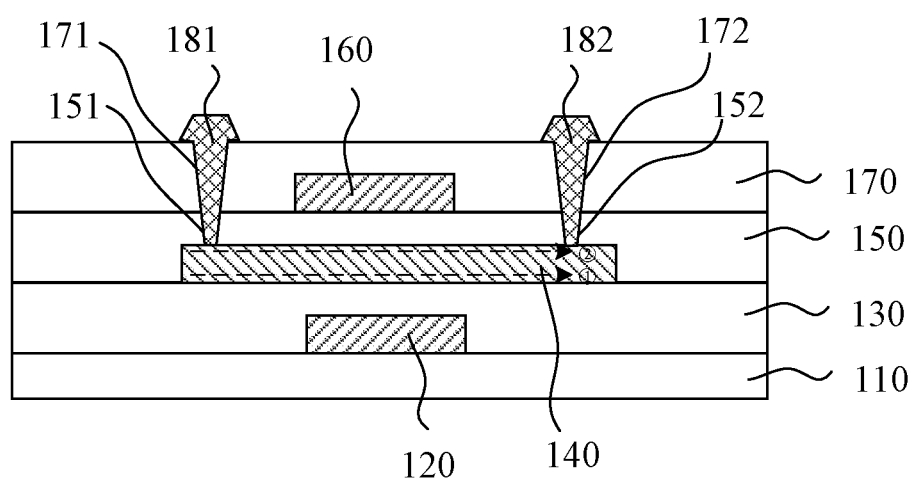
FIG. 2 is a schematic view illustrating the direction of electrical current in a semiconductor layer of the thin-film transistor of FIG. 1.

Referring also to FIG. 2, FIG. 2 is a schematic view illustrating the direction of electrical current in the semiconductor layer of the thin-film transistor of FIG. 1. In the instant embodiment, the thickness of the semiconductor layer 140 is set to be 200 nm-2000 nm, and such a thickness of the semiconductor layer 140 allows for formation of two current channels in the semiconductor layer 140. The two current channels will be respectively referred to as a first current channel (1) and a second current channel (2). The first current channel (1) is adjacent to the first gate insulation layer 130, and the second current channel (2) is adjacent to the etching stop layer 150. Electrical currents flowing through the first current channel (1) and the second current channel (2) are both in a direction from the source 181 to the drain 182. The thin-film transistor 100 has an ON-state current that is a sum of the current of the first current channel (1) and the current of the second current channel (2). Thus, the thin-film transistor 100 can have an increased ON-state current and accordingly, the switching speed of the thin-film transistor 100 is increased.

Figure 3:
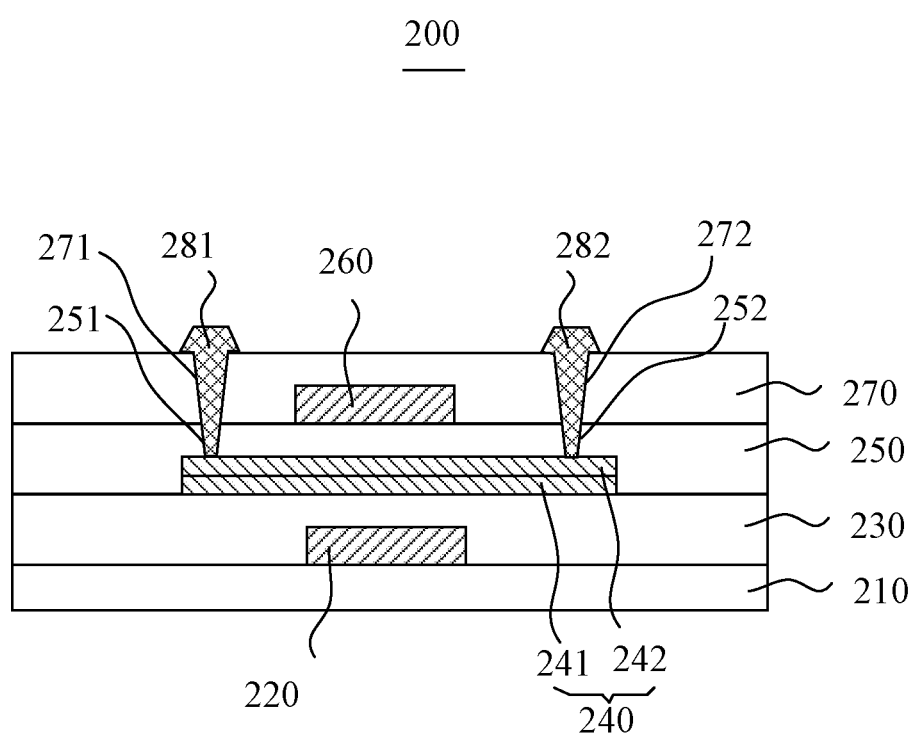
FIG. 3 is a schematic view showing a cross-sectional structure of a thin-film transistor according to another preferred embodiment of the present invention.

Referring to FIG. 3, FIG. 3 is a schematic view showing a cross-sectional structure of a thin-film transistor according to another preferred embodiment of the present invention. The thin-film transistor 200 comprises a substrate 210 and a first gate 220, a first gate insulation layer 230, at least two semiconductor layers 240, an etching stop layer 250, and the second gate 260 stacked on a surface of the substrate 210. The etching stop layer 250 comprises a first via 251 and a second via 252 formed therein. The first via 251 and the second via 252 are arranged to each correspond to the semiconductor layer 240. The thin-film transistor 200 further comprises a source 281 and a drain 282. The source 281 and the drain 282 respectively extend through the first via 251 and the second via 252 to connect to the semiconductor layer 240.

In other embodiments, the thin-film transistor 200 further comprises a buffering layer (not shown). The buffering layer functions to buffer the stress induced in the substrate 210 in forming other structures of the thin-film transistor 200 thereon so as to prevent damage or cracking of the substrate 210. Under this condition, the first gate 220, the first gate insulation layer 230, the semiconductor layers 240, the etching stop layer 250, and the second gate 260 are stacked, through the buffering layer, on the substrate 210. The buffering layer comprises a material selected from one of a silicon oxide layer, a silicon nitride layer, a silicon oxynitride layer, and combinations thereof.

The substrate 210 can be a glass substrate, a plastic substrate, or an insulation substrate.

The first gate 220 is arranged on a middle portion of the surface of the substrate 210. The first gate 220 comprises a material that is a metal or a metal alloy. In one embodiment, the material of the first gate 220 is selected from one of copper, tungsten, chromium, aluminum, and combinations thereof. The first gate 220 can be formed through the following steps. Firstly, a metal layer is completely formed on the entire surface of the substrate to form a complete metal layer. For easy description, the complete metal layer formed on the entire surface of the substrate is referred to as the "first metal layer". The first metal layer is then patternized to form the first gate 220 that is located on the middle portion of the substrate 210 according to the instant embodiment.

The first gate insulation layer 230 is set on and covers the first gate 220 and the substrate 210. The first gate insulation layer 230 comprises a material selected from one of a silicon oxide layer, a silicon nitride layer, a silicon oxynitride layer, and combinations thereof.

The semiconductor layers 240 are arranged on a surface of the first gate insulation layer 130 that is distant from the first gate 220. The semiconductor layers 140 provide channels that are conducted on or off between the source 281 and the drain 282 of the thin-film transistor 200. The etching stop layer 250 is set on and covers the semiconductor layers 240. Each of the semiconductor layers 240 may comprises the same material or may comprise different materials.

In the instant embodiment, an arrangement of two semiconductor layers 240 is taken as an example for illustration. For easy description, the two semiconductor layers 240 are respectively referred to as a first semiconductor layer 241 and a second semiconductor layer 242. The second semiconductor layer 242 and the first semiconductor layer 241 are sequentially stacked on the first gate insulation layer 230. In other words, the first semiconductor layer 241 is arranged on the surface of the first gate insulation layer 230 that is distant from the first gate 220 and the second semiconductor layer 242 is arranged to be adjacent to the etching stop layer 250.

The second gate 260 is arranged on a middle portion of a surface of the etching stop layer 250 that is distant from the semiconductor layers 240. The second gate 260 comprises a material that is a metal or an alloy. The material of the second gate 260 is selected from one of copper, tungsten, chromium, aluminum, and combinations thereof. In one embodiment, the material of the second gate 260 is the same as that of the first gate 220. In other embodiments, the material of the second gate 260 is different from that material of the first gate 220.

The thin-film transistor 200 further comprises a passive layer 270. The passive layer 270 is arranged on the second gate 160 and the passive layer 270 comprises a third via 271 and a fourth via 272 formed therein. The third via 271 is connected to and in communication with the first via 251 and the fourth via 272 is connected to and in communication with the second via 252. The source 281 extends through the third via 271 and the first via 251 to connect to the semiconductor layer 240, and the drain 282 extends through the fourth via 272 and the second via 252 to connect to the semiconductor layer 240.

The source 281 and the drain 282 are arranged to respectively correspond to two ends of the semiconductor layer 240. Materials of the source 281 and the drain 282 can be metals or metal alloys, or in one embodiment, the source 281 and the drain 282 can be formed of a transparent conductive material. Specifically, the materials of the source 281 and the drain 282 being a transparent conductive material is taken as an example for illustrating the formation of the source 281 and the drain 282. A layer of the transparent conductive material is formed on a surface of the passive layer 270 that is distant from the second gate 260 and is then patternized to define the source 281 and the drain 282. The transparent conductive material may comprise one of indium tin oxide, indium zinc oxide, indium oxide, and zinc oxide or any combination thereof.

The thin-film transistor 200 further comprises a first ohmic contact layer (not shown). The first ohmic contact layer is arranged between the source 281 and the semiconductor layers 240 so that the source 281 is connected via the first ohmic contact layer to the semiconductor layers 240. The first ohmic contact layer functions to reduce a contact resistance between the source 281 and the semiconductor layers 240.

The thin-film transistor 200 further comprises a second ohmic contact layer (not shown). The second ohmic contact layer is arranged between the drain 282 and the semiconductor layers 240 so that the drain 282 is connected via the second ohmic contact layer to the semiconductor layers 240. The second ohmic contact layer functions to reduce a contact resistance between the drain 282 and the semiconductor layers 240.

The semiconductor layers 240 have a lateral size that is greater than a lateral size of the first gate 220 and is also greater than a lateral size of the second gate 260. In the instant embodiment, a lateral direction is defined as a direction perpendicular to a direction of stacking the first gate 220, the first gate insulation layer 230, the semiconductor layers 240, the etching stop layer 250, and the second gate 260.

Figure 4:
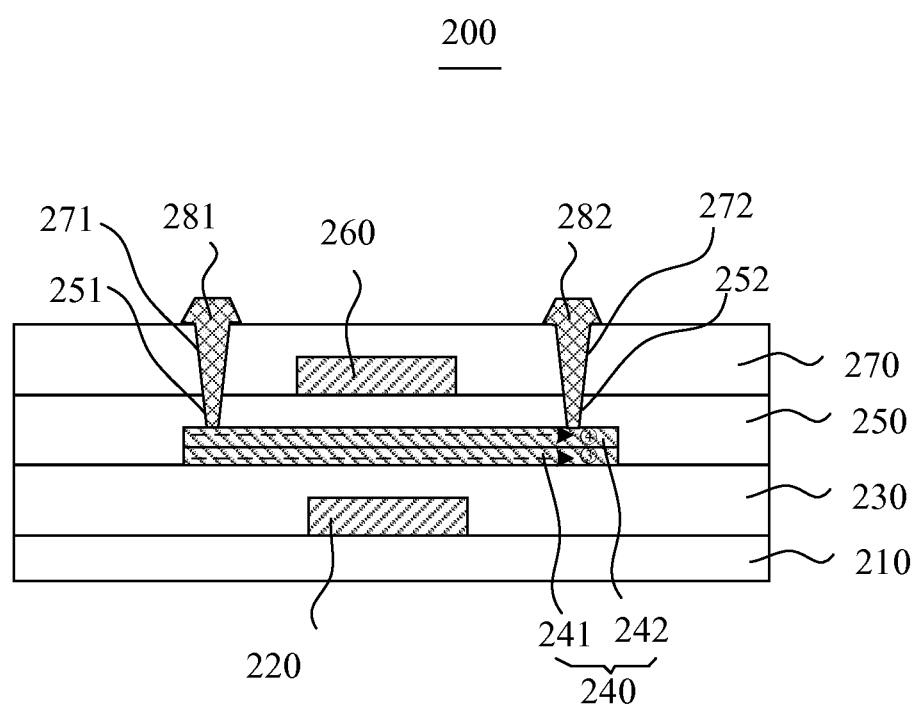
FIG. 4 is a schematic view illustrating the direction of electrical current in a semiconductor layer of the thin-film transistor of FIG. 3.

Referring also to FIG. 4, FIG. 4 is a schematic view illustrating the direction of electrical current in the semiconductor layer of the thin-film transistor of FIG. 3. The first semiconductor layer 241 and the second semiconductor layer 242 each form one current channel. The current channel formed in the first semiconductor layer 241 is referred to as a third current channel (3), and the current channel formed in the second semiconductor layer 242 is referred to as a fourth current channel (4). Electrical currents flowing through the third current channel (3) and the fourth current channel (4) are both in a direction from the source 281 to the drain 282. The thin-film transistor 200 has an ON-state current that is a sum of the current of the third current channel (3) and the current of the fourth current channel (4). Thus, the thin-film transistor 200 can have an increased ON-state current and accordingly, the switching speed of the thin-film transistor 200 is increased.

It can be appreciated that in other embodiments, the number of the semiconductor layers 240 used is not limited to two and can be any plural number.

Disclosed above is only one preferred embodiment of the present invention, which does not impose undue constraints to the scope of protection of the present invention. Those having ordinary skills of the art may readily appreciate that equivalent modifications that allow for realization of all or part of the operation process of the preferred embodiment described above and comply with the requirement defined in the appended claims are considered within the protection scope covered by the present invention.

What is claimed is:

1. A thin-film transistor, comprising:
a substrate;
a first gate, a first gate insulation layer, a semiconductor layer, an etching stop layer, and a second gate stacked on a surface of the substrate, wherein the semiconductor layer has a thickness that is that is between 200 nm and 2000 nm and is sufficient for formation of two current channels in the semiconductor layer and wherein first gate, the first gate insulation layer, the semiconductor layer, the etching stop layer, and the second gate are stacked sequentially in a vertical direction on the surface of the substrate to form a single stack;
the etching stop layer comprising a first via and a second via formed therein, the first via and the second via being arranged to each correspond to the semiconductor layer; and
a source and a drain, which respectively extend through the first via and the second via to connect to the semiconductor layer;
wherein the two current channels formed in the semiconductor layer comprise a first current channel and a second current channel that are respectively formed in a lower portion and an upper portion of the semi conductive layer and are respectively adjacent to the first gate insulation layer and the etching stop layer.

2. The thin-film transistor as claimed in claim 1, wherein the thin-film transistor further comprises a passive layer, which is stacked on the second gate, the passive layer comprising a third via and a fourth via formed therein, the third via being connected to and communicating with the first via, the fourth via being connected to and communicating with the second via, the source extending through the third via and the first via to connect to the semiconductor layer, the drain extending through the fourth via and the second via to connect to the semiconductor layer.

3. The thin-film transistor as claimed in claim 2, wherein the thin-film transistor further comprises a first ohmic contact layer, the first ohmic contact layer being arranged between the source and the semiconductor layer, the source being connected, via the first ohmic contact layer, to the semiconductor layer.

4. The thin-film transistor as claimed in claim 3, wherein the thin-film transistor further comprises a second ohmic contact layer, the second ohmic contact layer being arranged between the drain and the semiconductor layer, the drain being connected, via the second ohmic contact layer, to the semiconductor layer.

5. The thin-film transistor as claimed in claim 1, wherein the semiconductor layer has a lateral size that is greater than a lateral size of the first gate and is also greater than a lateral size of the second gate.

6. A thin-film transistor, comprising:
a substrate;
a first gate, a first gate insulation layer, two semiconductor layers that are stacked vertically on each other and in direct contact with each other for formation of two current channels therein, an etching stop layer, and a second gate stacked on a surface of the substrate, wherein first gate, the first gate insulation layer, the at least two semiconductor layers that are stacked vertically on each other, the etching stop layer, and the second gate are stacked sequentially in a vertical direction on the surface of the substrate to form a single stack;
the etching stop layer comprising a first via and a second via formed therein, the first via and the second via being arranged to each correspond to the semiconductor layers;
a source and a drain, which respectively extend through the first via and the second via to connect to the semiconductor layers;
wherein the two current channels are respectively formed in the two semiconductor layers that are stacked on each other and are in direct contact with each other.

7. The thin-film transistor as claimed in claim 6, wherein the thin-film transistor further comprises a passive layer, which is stacked on the second gate, the passive layer comprising a third via and a fourth via formed therein, the third via being connected to and communicating with the first via, the fourth via being connected to and communicating with the second via, the source extending through the third via and the first via to connect to the semiconductor layers, the drain extending through the fourth via and the second via to connect to the semiconductor layers.

8. The thin-film transistor as claimed in claim 7, wherein the thin-film transistor further comprises a first ohmic contact layer, the first ohmic contact layer being arranged between the source and the semiconductor layers, the source being connected, via the first ohmic contact layer, to the semiconductor layers.

9. The thin-film transistor as claimed in claim 8, wherein the thin-film transistor further comprises a second ohmic contact layer, the second ohmic contact layer being arranged between the drain and the semiconductor layers, the drain being connected, via the second ohmic contact layer, to the semiconductor layers.

10. The thin-film transistor as claimed in claim 6, wherein the semiconductor layers have a lateral size that is greater than a lateral size of the first gate and is also greater than a lateral size of the second gate.

* * * * *